United States Patent
Hu et al.

(10) Patent No.: US 9,361,182 B2
(45) Date of Patent: Jun. 7, 2016

(54) METHOD FOR READ DISTURBANCE MANAGEMENT IN NON-VOLATILE MEMORY DEVICES

(71) Applicant: Transcend Information, Inc., Taipei (TW)

(72) Inventors: Kun-Juao Hu, Taipei (TW); Hsieh-Chun Chen, New Taipei (TW)

(73) Assignee: Transcend Information, Inc., NeiHu Dist, Taipei (TW)

( * ) Notice: Subject to any disclaimer, the term of this patent is extended or adjusted under 35 U.S.C. 154(b) by 221 days.

(21) Appl. No.: 14/281,910

(22) Filed: May 20, 2014

(65) Prior Publication Data

US 2015/0339188 A1    Nov. 26, 2015

(51) Int. Cl.
*G06F 11/00* (2006.01)
*G06F 11/10* (2006.01)
*G06F 12/02* (2006.01)
*G06F 11/30* (2006.01)
*G11C 29/52* (2006.01)

(52) U.S. Cl.
CPC ............ *G06F 11/1072* (2013.01); *G06F 11/10* (2013.01); *G06F 11/30* (2013.01); *G06F 11/3034* (2013.01); *G06F 12/0246* (2013.01); *G06F 11/3037* (2013.01); *G06F 2201/81* (2013.01); *G06F 2201/88* (2013.01); *G06F 2212/7206* (2013.01); *G06F 2212/7209* (2013.01); *G06F 2212/7211* (2013.01); *G11C 29/52* (2013.01)

(58) Field of Classification Search
CPC .............. G06F 11/1072; G06F 11/076; G06F 11/3037; G06F 11/30; G06F 11/07; G06F 11/10; G06F 11/3034; G11C 29/52
See application file for complete search history.

(56) References Cited

U.S. PATENT DOCUMENTS

| 7,099,190 B2 * | 8/2006 | Noguchi ............ G11C 16/0483 365/185.03 |
| 2010/0122148 A1 * | 5/2010 | Flynn .................... G06F 11/108 714/773 |

* cited by examiner

*Primary Examiner* — Guy Lamarre
(74) *Attorney, Agent, or Firm* — Winston Hsu; Scott Margo

(57) ABSTRACT

When performing a read operation on a non-volatile memory device which includes a plurality of memory sections each corresponding to a plurality of data units, the read count of a specific memory section and the error bits of its corresponding data units are monitored for determining whether data relocation should be perform. When the read count of the specific section exceeds a read count threshold and the error bits of any corresponding data unit exceeds an error threshold, data is moved from the specific memory section to another memory section of the non-volatile memory device, thereby preventing read disturbance from occurring in the specific memory sections.

13 Claims, 3 Drawing Sheets

METHOD FOR READ DISTURBANCE MANAGEMENT IN NON-VOLATILE MEMORY DEVICES

BACKGROUND

1. Technical Field

The present invention is related to a method for operating non-volatile memory devices, and more particularly, to a method for read disturbance management in non-volatile memory devices.

2. Description of the Conventional Art

Semiconductor memory devices are generally divided into two groups: volatile memory devices and non-volatile memory devices. Volatile memory devices include Dynamic Random Access Memory (DRAM) devices and Synchronous Random Access Memory (SRAM) devices. Non-volatile memory devices include Electrically Erasable Programmable Read Only Memory (EEPROM) devices, Ferroelectric Random Access Memory (FRAM) devices, Phase-change Random Access Memory (PRAM) devices, Magnetic Random Access Memory (MRAM) devices, and flash memory devices, etc. When power supply is cut off, volatile memory devices lose the data stored therein, while non-volatile memory devices can retain the data stored therein. Particularly, since flash memory devices are characterized in high programming speed, low power consumption and large-capacity data storage, they are widely used as non-volatile memory for computing devices such as desktop and laptop computers, personal digital assistants (PDAs), digital cameras, tablet computers, smartphones, and the like.

Flash memory devices, such as NOR-type flash memory devices with excellent random access time characteristics or NAND-type flash memory devices with high integration degree, may adopt different cell structures in which electric charges may be placed on or removed from a flash memory cell to configure the cell into a specific memory state. For example, a single level cell (SLC) may be configured to two single-bit binary states (i.e., 0 or 1). Similarly, a multi-level cell (MLC) may be programmed to two-bit states (i.e., 00, 01, 10, or 11), three-bit states, and so on.

As data is being read from a flash memory device, a phenomenon known as "read disturbance" can occur to adjacent memory cells. Read disturbance is caused when a page in the flash memory device is read numerous times and adjacent memory cells are affected by electron migration to the point that the data stored in the adjacent cells is changed. The occurrence of read disturbance may impact data accuracy of SLC/MLC flash memory devices.

Therefore, there is a need for a method of improving read disturbance in non-volatile memory devices.

SUMMARY

The present invention provides a method for read disturbance management in a non-volatile memory device which includes a plurality of memory sections each having a plurality of data units. The method includes performing a read operation on the plurality of data units; updating a read count of a first memory section among the plurality of memory sections according to a total read number of the read operation which has been performed on the plurality of data units of the first memory section since data was last written into the first memory section; scanning the first memory section for acquiring error bits of all corresponding data units when the read count of the first memory section exceeds a read count threshold; and moving the data from the first memory section to a second memory section among the plurality of memory sections when the error bits of any corresponding data unit exceeds an error threshold.

The present invention also provides a method for read disturbance management in a flash memory device which includes a plurality of blocks each having a plurality of pages. The method includes performing a read operation on the plurality of pages; updating a read count of a first block among the plurality of blocks according to a total read number of the read operation which has been performed on the plurality of pages of the first block since data was last written into the first block; scanning the first block for acquiring error bit values of all pages in the first block when the read count of the first block exceeds a read count threshold; and moving the data from the first block to a second block among the plurality of blocks when the error bit value of any page in the first block exceeds an error threshold.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
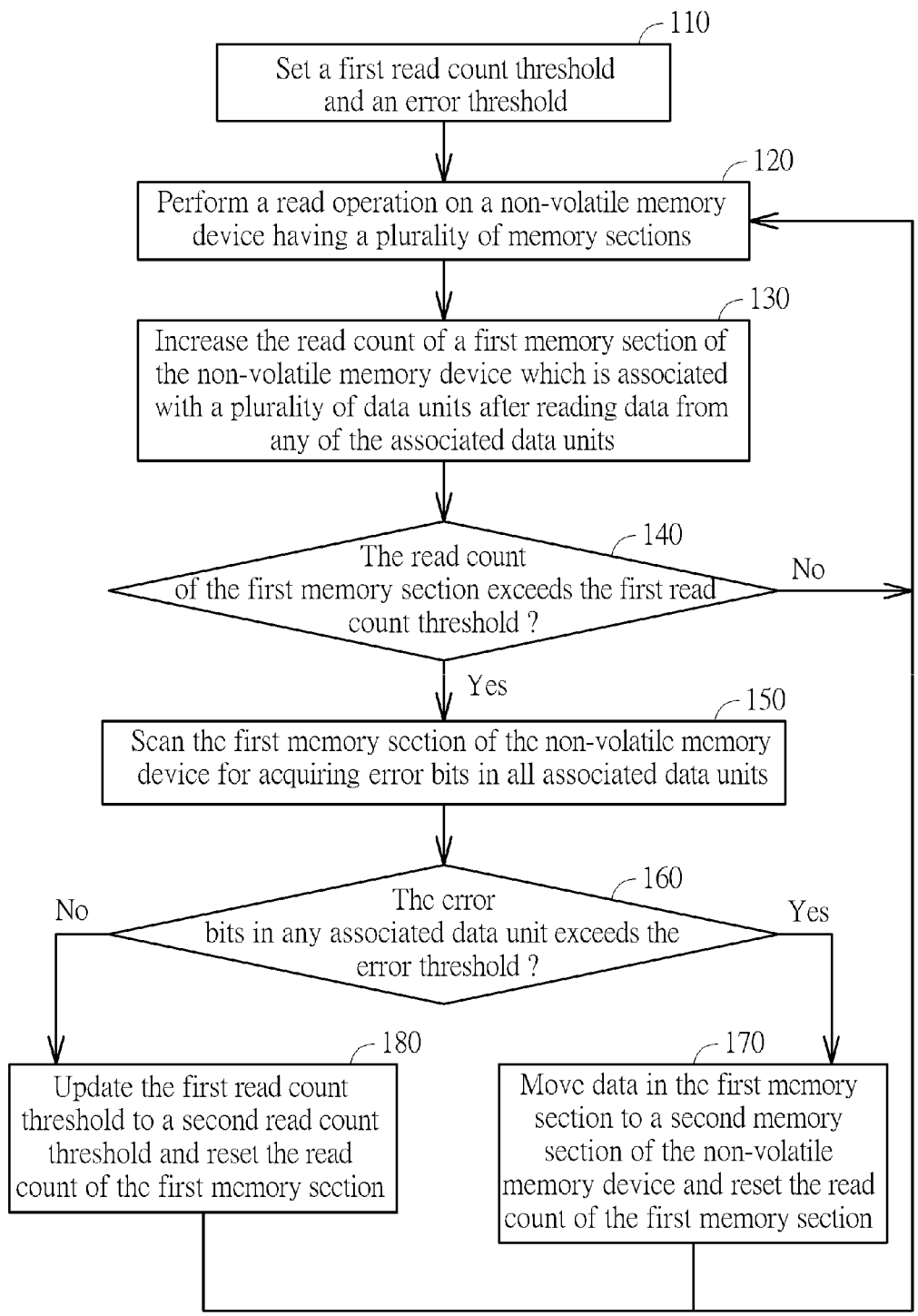
FIG. 1 is a flowchart illustrating a method for read disturbance management in a non-volatile memory system according to an embodiment of the present invention.

FIG. 1 is a flowchart illustrating a method for read disturbance management in a non-volatile memory system according to an embodiment of the present invention. The flowchart in FIG. 1 includes the following steps:

Step 110: set a first read count threshold and an error threshold; execute step 120.

Step 120: perform a read operation on a non-volatile memory device having a plurality of memory sections; execute step 130.

Step 130: increase the read count of a first memory section of the non-volatile memory device which is associated with a plurality of data units after reading data from any of the associated data units; execute step 140.

Step 140: determine whether the read count of the first memory section exceeds the first read count threshold; if yes, execute step 150; if no, execute step 120.

Step 150: scan the first memory section of the non-volatile memory device for acquiring the error bits in all associated data units; execute step 160.

Step 160: determine whether the error bits in any associated data unit exceeds the error threshold; if yes, execute step 170; if no, execute step 180.

Step 170: move data in the first memory section to a second memory section of the non-volatile memory device and reset the read count of the first memory section; execute step 120.

Step 180: update the first read count threshold to a second read count threshold and reset the read count of the first memory section; execute step 120.

Figure 2:
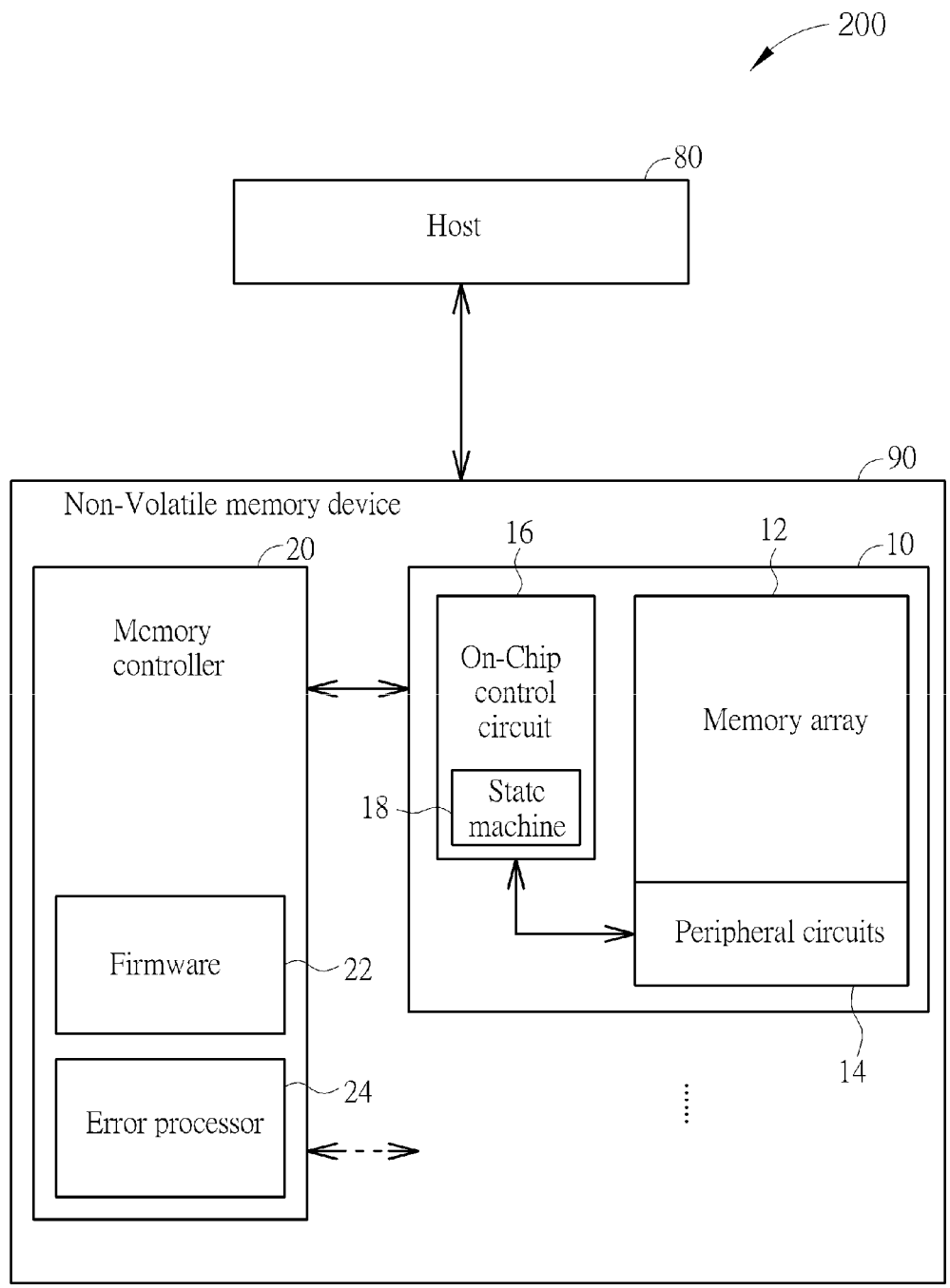
FIG. 2 is a functional diagram illustrating a non-volatile memory system for performing the present method.

FIG. 2 is a functional diagram illustrating a non-volatile memory system 200 for performing the present method depicted in FIG. 1. The non-volatile memory system 200 includes a host 80 in communication with a memory device 90. The host 80 may send data to be stored to the memory device 90 (write operation) or retrieve data from the memory device 90 (read operation). The memory device 90 includes one or multiple memory chips 10 managed by a memory controller 20. Each memory chip 10 includes a memory array 12, peripheral circuits 14 and an on-chip control circuit 16. The memory array 12 consists of memory cells which may adopt MLC or SLC structure. The peripheral circuits 14 may include row and column decoders, sense modules, data latches and I/O circuits (not shown). The on-chip control circuit 16 includes a state machine 18 and is configured to cooperate with the peripheral circuits 14 to control low-level memory operations on the memory array 12.

In many implementations, the host 80 is configured to communicate and interact with each memory chip 10 via the memory controller 20 which includes firmware 22 and an error processor 24. The firmware 22 provides codes to implement the functions of the memory controller 20. The error processor 24 is configured to detect and correct error bits in each smallest unit (ex: page) in the memory array 12 during operations of the memory device 90. Therefore, the memory controller 20 may cooperate with the memory chips 10 and control high-level memory operations on the memory arrays 12.

In the embodiments of the present invention, the memory device 90 may be an EEPROM device, an FRAM device, a PRAM device, an MRAM device, or a flash memory device. For illustrative purpose, a flash-type memory device 90 is used to explain the present invention in subsequent paragraphs. However, the type of non-volatile memory device does not limit the scope of the present invention.

Figure 3:
FIG. 3 is a diagram illustrating the memory arrangement of a memory array in a flash-type memory device according to an embodiment of the present invention.

FIG. 3 is a diagram illustrating the memory arrangement of the memory array 12 in the flash-type memory device 90 according to an embodiment of the present invention. The memory array 12 includes a plurality of memory blocks $BLOCK_1$-$BLOCK_M$, each of which includes a plurality of pages $PAGE_1$-$PAGE_N$ (M and N are positive integers). Generally in flash memory devices, a block is the smallest portion of the memory array 12 that can be erased, and a page is the smallest unit that can be written or read from the memory array 12. When the non-volatile memory system 200 is implemented with the flash-type memory device 90 for performing the present method, the first memory section and the second memory section may be any two of the memory blocks $BLOCK_1$-$BLOCK_M$ in the memory array 12, while the data units may be the pages $PAGE_1$-$PAGE_N$ in any of the pages $PAGE_1$-$PAGE_N$ in the memory array 12. When the non-volatile memory system 200 is implemented with another type of the memory device 90 for performing the present method, different terms may be used when referring to the "memory section" and "data unit" of the memory device 90.

In an embodiment, the memory arrangement of the memory array 12 depicted in FIG. 3 may represent physical storage space on the flash-type memory device 90, such as by means of cylinder-head-sector (CHS) addressing. In another embodiment, the memory arrangement of the memory array 12 depicted in FIG. 3 may represent logical storage space on the flash-type memory device 90, such as by means of logical block address (LBA) addressing. However, how the "memory section" and "data unit" are addressed in the memory device 90 does not limit the scope of the present invention.

The method depicted in FIG. 1 is now illustrated in accordance with FIGS. 2 and 3. In step 110, the first read count threshold indicates how likely a current data read may cause read disturbance, and may be determined according the type, the status and/or the ambient environment of the flash-type memory device 90, alone or in any combination.

In an embodiment, the ability of the memory device 90 to resist read disturbance may be taken into account when setting the first read count threshold in step 110. For illustrative purpose, it is assumed that the memory array 12 adopts an MLC structure with a guaranteed Programming/Erase (P/E) cycle of 3,000. That is, when the current P/E cycle of the memory array 12 does not exceed 3,000, each page in the blocks of the memory array 12 can withstand 10,000 reads (hereafter referred as "the maximum allowable read times") without generating unrepairable amount of error bits. However, when the current P/E cycle of the memory array 12 exceeds 3,000, each page in the blocks of the memory array 12 can only withstand 5,000 reads without generating unrepairable amount of error bits. Under such circumstances, the first read count threshold may be set to an initial value which is smaller than the ability to resist read disturbance (defined by the maximum allowable read times) by a certain amount. For example, the first read count threshold may be set to 8,000 (10,000*0.8).

In another embodiment, the type of the memory device 90, such as the cell structure of the memory array 12, may be taken into account when setting the first read count threshold in step 110. For example, the first read count threshold may be set to 80,000 when the memory array 12 adopts SLC structure whose maximum allowable read times is equal to 100,000, or may be set to 8000 when the memory array 12 adopts MLC structure whose maximum allowable read times is equal to 10,000.

In another embodiment, the status of the memory device 90, such as the wear level of the memory array 12, may be taken into account when setting the first read count threshold in step 110. The wear level of the memory array 12 may be obtained according to indicators which are used to record the P/E counts of each block. A non-volatile memory device with high wear level is more prone to be affected by read disturbance. Therefore, for MLC structure whose maximum allowable read times is equal to 10,000, the first read count threshold may be set to 8000 when the memory array 12 has a low wear level, but may be set to 7000 when the memory array 12 has a high wear level.

In another embodiment, the ambient environment of the memory device 90, such as the operational temperature of the non-volatile memory system 200, may be taken into account when setting the first read count threshold in step 110. More specifically, the first read count threshold may be set in a way so as to compensate the influence of the ambient environment on read disturbance. For example, for MLC structure whose maximum allowable read times is equal to 10,000, the first read count threshold may be set to 8000 when the flash-type memory device 90 is operating in a normal-temperature environment, but may be set to 7000 when the flash-type memory device 90 is operating in a high-temperature environment or a low-temperature environment in which read disturbance may occur more easily.

In step 120, the host 80 may read data from any page in any block of the flash-type memory device 90 during each access. In step 130, the read count of a specific block of the flash-type memory device 90 may be increased by 1 after each time data is read from any of its pages. In step 140, it is determined whether the read count of the specific block exceeds the first read count threshold. Step 140 may be performed by the memory controller 20 and/or the on-chip control circuit 16 of the flash-type memory device 90.

The read count of a specific memory section is associated with the total read number of the read operation which has been performed on the pages of the specific memory section since data was last written into the specific memory section. For illustrative purposes, assume that the initial read counts of all blocks in the flash-type memory device 90 are zero before performing the read operation. In one scenario when the read operation includes 3 data accesses which is much smaller than the first read count threshold, the read operation may be performed by executing steps 120-140 three times. If the read operation includes accessing data from the pages $PAGE_0$-$PAGE_2$ of the block $BLOCK_0$, the final read count of the block $BLOCK_0$ would be 3 and the final read counts of the blocks $BLOCK_1$-$BLOCK_M$ remain 0 at the end of the read operation. If the read operation includes accessing data from the pages $PAGE_0$ of the blocks $BLOCK_0$-$BLOCK_2$, the final read counts of the blocks $BLOCK_0$-$BLOCK_2$ would each be 1 and the final read counts of the blocks $BLOCK_3$-$BLOCK_M$ remain 0 at the end of the read operation. If the read operation includes accessing data from the page $PAGE_0$ of the block $BLOCK_0$, the page $PAGE_0$ of the block $BLOCK_1$, the page $PAGE_1$ of the block $BLOCK_0$, sequentially, the final read count of the block $BLOCK_0$ would be 2, the final read count of the block $BLOCK_1$ would be 1, and the final read counts of the blocks $BLOCK_2$-$BLOCK_M$ remain 0 at the end of the read operation.

In another scenario, the total read number of the read operation may be much larger than the first read count threshold. After executing steps 120-140 many times, the read count of the specific block may exceed the first read count threshold at a certain point when many reads have occurred in the specific block. Subsequent reads from any page of the specific block may cause read disturbance more likely. Therefore, when it is determined in step 140 that the read count of the specific block exceeds the first read count threshold, step 150 is then executed for acquiring the error bits of all pages in the specific block.

In the present invention, step 150 may be executed by the error processor 24 using any known error detection scheme, such as repetition code, parity bit, checksum, cyclic redundancy check (CRC), cryptographic hash function or error correction code (ECC). However, the types of error detection scheme do not limit the scope of the present invention.

Back in step 110, the error threshold may be determined according to the error detection scheme adopted by the flash-type memory device 90. The error threshold is used to determine whether data relocation should be performed before the current amount of detected error bits is beyond repair. If the error bits of a specific page is smaller than the error threshold, there is still sufficient margin for more repairable error bits to be generated in the specific page and no data relocation needs to be performed; if the error bits of a specific page is larger than the error threshold, subsequent error bits generated in the specific page may become unrepairable and data relocation needs to be performed in step 170. For example, if the error processor 24 is able correct 40 error bits among 1024-bit data, the error threshold may be set to any value smaller than 40.

If it is determined in step 160 that the error bits of any page in the specific block exceeds the error threshold, the data in the specific block is moved to another block of the flash-type memory device 90 in step 170. Therefore, the error bits caused by read disturbance after accessing the specific block many times can be removed. The read count of the specific block is reset after data relocation. This way, subsequent reads may continue to be performed on any page of the specific block with reduced possibility of causing read disturbance.

If it is determined in step 160 that the error bits of all pages in the specific block do not exceed the error threshold, no data relocation is performed. However, since the specific block has already experienced a certain amount of read cycles, subsequent reads from the specific block may cause read disturbance more easily than other blocks whose read counts have not yet exceeded the first read count threshold. Therefore, the first read count threshold is then updated to the second read count threshold in step 180.

In an embodiment, the second read count threshold updated in step 180 is smaller than the original first read count threshold set in step 110. For example, for MLC structure whose maximum allowable read times is equal to 10,000, the first read count threshold may be set to 8000 in step 110 and then updated to the second read count threshold of 500 in step 180. In other words, the specific block is scanned for the first time to acquire the error bits of all pages after accumulating 8000 read counts, but subsequent scans are performed every 500 read counts before the error bits of any page in the specific block exceeds the error threshold.

In the present invention, data relocation may be performed on a first memory section of a non-volatile memory device according to two factors: the read count of the first memory section and the error bits of the data units associated with the first memory section. A dynamic read count threshold may be set to monitor the read count of the first memory section. An error threshold may be set to monitor the error bits of the associated data units and prevent unnecessary data relocation from being performed. Therefore, by performing data relocation only when necessary based on the above-mentioned two factors, the present invention can improve read disturbance in non-volatile memory devices without influencing its efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for read disturbance management in a non-volatile memory device which includes a plurality of memory sections each having a plurality of data units, the method comprising:
    performing a read operation on the plurality of data units;
    updating a read count of a first memory section among the plurality of memory sections according to a total read number of the read operation which has been performed on the plurality of data units of the first memory section since data was last written into the first memory section;
    scanning the first memory section for acquiring error bits in all corresponding data units when the read count of the first memory section exceeds a first read count threshold, and updating the first read count threshold to a second read count threshold and resetting the read count of the first memory section when the error bits in all corresponding data units do not exceed an error threshold, wherein the second read count threshold is smaller than the first read count threshold; and
    moving the data from the first memory section to a second memory section among the plurality of memory sections when the error bits in any corresponding data unit exceeds the error threshold.

2. The method of claim 1, further comprising:
    resetting the read count of the first memory section after moving the data from the first memory section to the second memory section.

3. The method of claim 1, wherein the first read count threshold is determined according to at least one of a type, a status or an ambient environment of the non-volatile memory device.

4. The method of claim 1, further comprising:
setting the error threshold according to an error detection scheme adopted by the non-volatile memory device for acquiring the error bits.

5. The method of claim 1, wherein the plurality of the memory sections correspond to physical storage space of the non-volatile memory device.

6. The method of claim 1, wherein the plurality of the memory sections correspond to logical storage space of the non-volatile memory device.

7. A method for read disturbance management in a flash memory device which includes a plurality of blocks each having a plurality of pages, the method comprising:
performing a read operation on the plurality of pages;
updating a read count of a first block among the plurality of blocks according to a total number of the read operation which has been performed on the plurality of pages of the first block since data was last written into the first block;
scanning the first block for acquiring error bit values of all pages in the first block when the read count of the first block exceeds a first read count threshold, and updating the first read count threshold to a second read count threshold and resetting the read count of the first block when the error bit values of all pages in the first block do not exceed an error threshold, wherein the second read count threshold is smaller than the first read count threshold; and
moving the data from the first block to a second block among the plurality of blocks when the error bit value of any page in the first block exceeds the error threshold.

8. The method of claim 7, further comprising:
resetting the read count of the first block after moving the data from the first block to the second block.

9. The method of claim 7, further comprising:
setting the first read count threshold according to at least one of a type, a status or an ambient environment of the flash memory device.

10. The method of claim 9, further comprising:
setting the first read count threshold to a first value when the flash memory device adopts a single level cell (SLC) structure or to a second value when the flash memory device adopts a multi-level cell (MLC) structure, wherein the first value is larger than the second value.

11. The method of claim 9, wherein the first read count threshold or the second read count threshold is smaller than a maximum allowable read times associated with a guaranteed Programming/Erase (P/E) cycle of the flash memory device.

12. The method of claim 9, further comprising:
setting the first read count threshold to a first value when the flash memory device has a first wear level or to a second value when the flash memory device has a second wear level, wherein the first value is larger than the second value when the first wear level is lower than the second wear level.

13. The method of claim 9, further comprising:
setting the first read count threshold to a first value when the flash memory device operates at a first temperature or to a second value when the flash memory device operates at a second temperature, wherein the first value is larger than the second value when the first temperature is different from the second temperature by a predetermined amount.

\* \* \* \* \*